United States Patent
Hwang et al.

(10) Patent No.: US 7,446,325 B2
(45) Date of Patent: Nov. 4, 2008

(54) REFLECTOR FOR GENERATING A NEUTRAL BEAM AND SUBSTRATE PROCESSING APPARATUS INCLUDING THE SAME

(75) Inventors: Sung-Wook Hwang, Seoul (KR); Chul-Ho Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 453 days.

(21) Appl. No.: 11/341,558

(22) Filed: Jan. 30, 2006

(65) Prior Publication Data
US 2006/0219887 A1 Oct. 5, 2006

(30) Foreign Application Priority Data
Mar. 15, 2005 (KR) .................... 10-2005-0021551

(51) Int. Cl.
*H01S 3/00* (2006.01)
(52) U.S. Cl. .................. 250/492.21; 250/492.1; 250/492.2; 250/251
(58) Field of Classification Search ... 250/492.1–492.3, 250/251
See application file for complete search history.

(56) References Cited

U.S. PATENT DOCUMENTS

| | | | | |
|---|---|---|---|---|
| 4,662,977 A | | 5/1987 | Motley et al. | |
| 5,776,253 A | * | 7/1998 | Asakawa et al. | 118/723 CB |
| 5,795,385 A | * | 8/1998 | Asakawa et al. | 117/104 |
| 5,814,150 A | * | 9/1998 | Asakawa et al. | 117/200 |
| 5,993,538 A | * | 11/1999 | Asakawa et al. | 117/8 |
| 6,032,611 A | * | 3/2000 | Asakawa et al. | 118/723 CB |

FOREIGN PATENT DOCUMENTS

| | | |
|---|---|---|
| JP | 09-147787 | 6/1997 |
| KR | 10-2001-0102628 | 11/2001 |
| KR | 10-2002-0039840 | 5/2002 |
| KR | 1020030042958 A | 6/2003 |
| KR | 10-2004-0033524 | 4/2004 |

OTHER PUBLICATIONS

Korean Office Action dated Aug. 25, 2006.

* cited by examiner

*Primary Examiner*—Jack I. Berman
*Assistant Examiner*—Andrew Smyth
(74) *Attorney, Agent, or Firm*—Harness Dickey & Pierce, P.L.C.

(57) ABSTRACT

Example embodiments of the present invention provide a reflector for generating a neutral beam and a substrate processing apparatus including the same. The reflector may include at least one reflecting plate including a reflecting layer onto which an ion beam collides and a supporting layer. The reflecting layer may reflect and convert the ion beam into a neutral beam, and the supporting layer may reduce thermal deformation of the reflecting layer.

21 Claims, 3 Drawing Sheets

REFLECTOR FOR GENERATING A NEUTRAL BEAM AND SUBSTRATE PROCESSING APPARATUS INCLUDING THE SAME

PRIORITY STATEMENT

This application claims the benefit of priority to Korean Patent Application No. 10-2004-0021551, filed on Mar. 15, 2005, in the Korean Intellectual Property Office, the entire contents of which is incorporated herein by reference.

BACKGROUND OF THE INVENTION

1. Field of the Invention

Example embodiments of the present invention relate to a substrate processing apparatus used for a manufacturing process of a semiconductor device, and more particularly, to a reflector for generating a neutral beam and a substrate processing apparatus including the same.

2. Description of the Related Art

Conventionally, in a manufacturing process of a semiconductor device, a plasma process may be used for a dry etching process, a physical or chemical vapor deposition process, a surface treatment process, etc. In a plasma process, a high frequency power may be applied to a chamber at the same time a reaction gas is supplied inside of the chamber. Accordingly, the reaction gas may be dissociated in the chamber to excite plasma by means of a glow discharge. At this time, ions included in the plasma may be used to perform substrate processing.

As semiconductor device become more integrated, integrated circuit design rules have decreased. For example, current integrated circuit design rules have decrease to approximately 0.1 μm or less. Accordingly, processing conditions of semiconductor processing apparatuses have become stricter in order to manufacture integrated circuits. Plasma processing apparatuses have been forced to improve to cope with the stricter manufacturing conditions. The improvement has been mainly obtained by techniques relating to increasing plasma density and/or uniformly distributing plasma.

However, no matter how the performance of a plasma is improved, the plasma has a specific limitation based on basic physical properties thereof. For example, because plasma includes a plurality of electrically charged ions and the ions collide with a semiconductor substrate and/or a specific material layer on a semiconductor substrate with an energy level of hundreds eV, the ions may cause physical and/or electrical damage to the semiconductor substrate and/or the specific material on the semiconductor substrate. For example, a surface of a single crystal semiconductor substrate and/or a specific material layer may be transformed into an amorphous state, and/or a chemical composition thereof may be changed. Further, an atomic bond in the surface layer may be broken due to an ion collision and a dangling bond may be generated. Still further, notching in a polysilicon layer due to charge-up damage on an insulating layer of a gate and/or a charging of a photo resist may be generated.

At least in part to solve some of the above described problems, research on a semiconductor element manufacturing process using a neutral beam instead of an ion beam has been performed. For example, substrate processing may be performed by neutralizing ions generated from a plasma and by directing the ions to a surface of a substrate. Conventional methods of neutralizing ions may include causing ions to collide with neutrons, electrons, and/or a reflection plate. A method of colliding ions with a reflection plate provides excellent efficiency of neutralization.

However, conventional methods that include generating neutral beams from ions colliding with a reflection plate have problems. For example, because ions may collide with a reflection plate with a high energy, the reflection plate may be thermally deformed. If a reflection plate becomes thermally deformed, an angle of a neutral beam reflected from the reflection plate may not be uniform, and thus a process yield may decrease and/or a procedure failure may occur.

SUMMARY OF THE INVENTION

An example embodiment of the present invention provides a reflector for generating a neutral beam. The reflector may include a reflection plate that is resistant to thermal deformation, and a substrate processing apparatus including a reflector for generating a neutral beam.

An example embodiment of the present invention provides a reflector for generating a neutral beam. The reflector may include at least one reflecting plate including a reflecting layer onto which an ion beam collides and a supporting layer. The reflecting layer may reflect and convert the ion beam into a neutral beam, and the supporting layer may reduce thermal deformation of the reflecting layer.

An example embodiment of the present invention provides a substrate processing apparatus including a reflector. A substrate processing apparatus may include an ion source, a reflector and a substrate support member. The reflector may include at least one reflecting plate onto which an ion beam supplied from an ion source may collide. The reflecting layer may reflect and convert an ion beam into a neutral beam, and a supporting layer may reduce thermal deformation of the reflecting layer. The reflector may be arranged in a path of an ion beam supplied from an ion source. Further, the substrate supporting member may hold a substrate to be processed and may be arranged in a path of a neutral beam.

BRIEF DESCRIPTION OF THE DRAWINGS

Example embodiments of the present invention will be more clearly understood from the detailed description taken in conjunction with the accompanying drawings.

DETAILED DESCRIPTION OF EXAMPLE EMBODIMENTS OF THE PRESENT INVENTION

Figure 1:
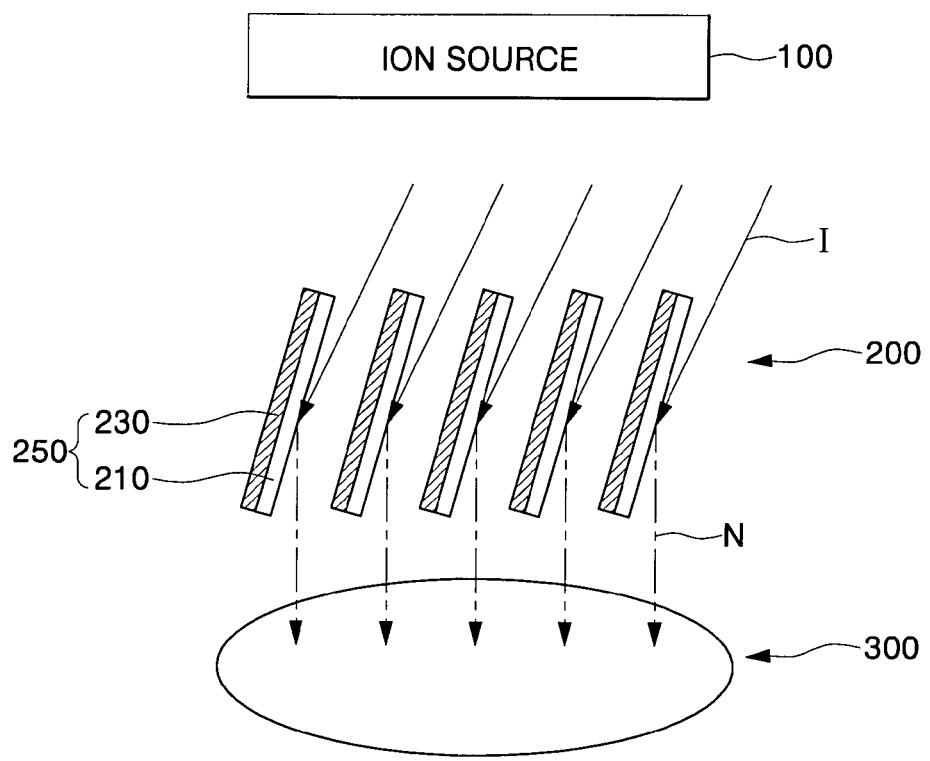
FIG. 1 is a schematic view illustrating a substrate processing apparatus according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Figure 4:
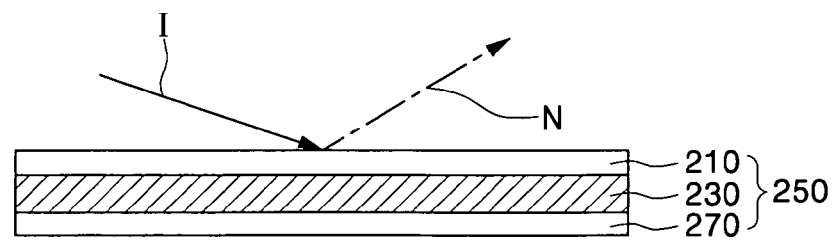
FIG. 4 is a sectional view illustrating a reflection plate according to an example embodiment of the present invention.

Referring to an example embodiment of the present invention as shown in FIG. 1, an ion beam I may be incident on an inside of a reflector 200. An ion beam I may be supplied from a ion source 100. An ion source 100 may include a plasma generator and a grid unit which may extract ions from the plasma generator and accelerate the ions. A reflector 200 may include reflecting plates 250 which may be disposed substantially parallel to each other and have a predetermined angle with respect to an ion beam I. According to an example embodiment of the present invention, each of the reflecting plates 250 may include a reflecting layer 210 and a supporting layer 230 which may contact with each other. Further, according to an example embodiment of the present invention as shown in FIG. 4, a reflecting plate 250 may further include a reaction prevention layer 270 which may contact with a supporting layer 230 and oppose a reflecting layer 210. Reflecting plates 250 will be described later in detail. An ion beam I may lose its electric charge and may be converted into a neutral beam after the ion beam collides with a reflecting layer 210. A substrate 300 may be disposed in a path of a neutral beam N, and a process by the neutral beam N, for example, an etching process, may be performed.

Figure 2:
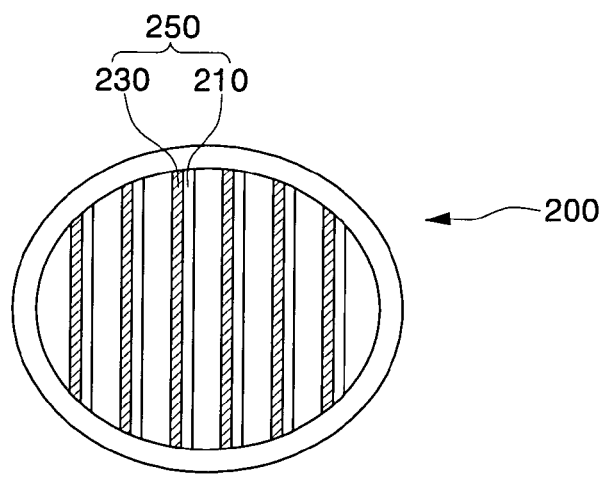
FIG. 2 is a plan view of a reflector according to an example embodiment of the present invention.
Figure 3:
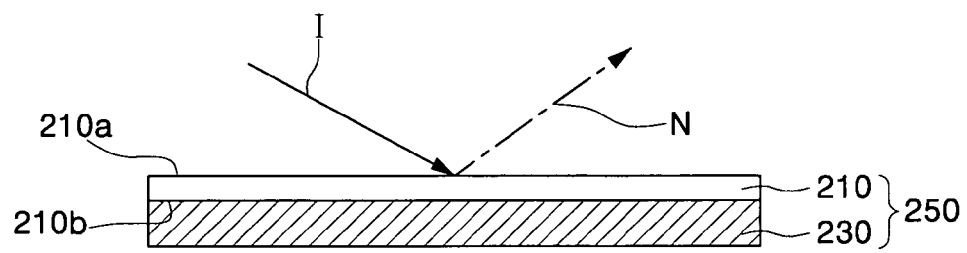
FIG. 3 is an exploded sectional view illustrating a reflection plate of an example embodiment of the present invention as shown in FIG. 2.

FIG. 2 is a plan view of a reflector according to an embodiment of the present invention, and FIG. 3 is an exploded sectional view of a reflecting plate according to an example embodiment of the present invention as shown in FIG. 2.

According to example embodiments of the present invention shown in FIGS. 2 and 3, a reflector 200 may include reflecting plates 250 having a reflecting layer 210 and a supporting layer 230. Reflecting layer 210 may have a first surface 210*a* and a second surface 210*b* opposite the first surface 210*a*. Supporting layer 230 may be disposed on a second surface 210*b* of a reflecting layer 210 and may prevent thermal deformation of a reflecting layer 210.

According to an example embodiment of the present invention, a material used for a reflecting plate for generating a neutral beam has one or more of the following characteristics. An incident surface on which an ion beam collides may have a low surface roughness to obtain a uniform angle distribution of a neutral beam reflected from a reflecting plate. Further, the material may have a high electrical conductivity. Still further, a material may have a low chemical reactivity and/or a low sputtering yield to reduce and/or prevent surface deformation of an incident surface and contamination of a substrate to be processed. Furthermore, a material may have a high thermal conductivity and/or a low coefficient of thermal expansion to reduce and/or prevent thermal deformation due to an ion beam colliding with the material.

According to example embodiments of the present invention, reflecting plates 250 may have at least a two-layer structure including a reflecting layer 210 and a supporting layer 230 as described above. For example, a supporting layer 230 may reduce and/or prevent thermal deformation of a reflecting layer 210. The supporting layer 230 may have a high thermal conductivity to reduce and/or prevent thermal deformation of a reflecting layer 210. If supporting layer 230 has a high thermal conductivity, a supporting layer 230 may serve as a heat sink for emitting heat generated at a reflecting layer 210 according to an example embodiment of the present invention. Accordingly, a supporting layer 230 may reduce and/or prevent thermal deformation of a reflecting layer 210, which may suppress thermal deformation of a reflecting plate 250. According to an example embodiment of the present invention, a supporting layer 230 may have a high thermal conductivity of about 100 W/m·K or more. Further, a supporting layer 230 may include one or more metals including, but not limited to, aluminum (Al), copper (Cu), silver (Ag), gold (Au), molybdenum (Mo), silicon (Si), and tungsten (W), and/or non-metallic materials including, but not limited to, silicon carbide (SiC), tungsten carbide (WC), and aluminum nitride (AlN). The material which may be used for supporting layer 230 is not limited thereto, and various materials having an excellent thermal stability capable of reducing and/or preventing thermal deformation of a reflecting layer 210 may be used. Further, according to an example embodiment of the present invention, a supporting layer 230 may have a low coefficient of thermal expansion to suppress thermal deformation of reflecting plates 250. Accordingly, a reflecting layer 210 and a supporting layer 230 may have a substantially equal coefficient of thermal expansion for reducing and/or preventing thermal deformation due to a difference in the coefficient of thermal expansion thereof.

As described above, a reflecting layer 210 may have a low surface roughness, a high electrical conductivity, a low chemical reactivity, and/or a low sputtering yield. Further, a reflecting layer 210 may be made of alloy to satisfy the above conditions. For example an allow may be useful in providing a low sputtering yield. For example, a reflecting layer 210 may be made of stainless steel, nickel-iron alloy, nickel-chromium alloy, or nickel-iron-chromium alloy. However, the material of the reflecting layer 210 is not limited thereto, and a metal and/or alloy satisfying the above-described conditions may be adapted thereto without limitation. In an example embodiment of the present invention, a supporting layer 230 may be made of molybdenum having a thermal conductivity of about 138 W/m·K and a coefficient of thermal expansion of about 5.4, and reflecting layer 210 may be made of nickel-iron alloy having a thermal conductivity of about 10.5 W/m·K and a coefficient of thermal expansion of about 5.3.

In a reflecting layer 210, a surface state and an electrical characteristic of the incident surface, that is, a first surface 210a into which ions may collide, are important regardless of a thickness thereof. For example, a thickness of the reflecting layer 210 may be reduced and/or s minimized, and a supporting layer 230 for reducing and/or preventing thermal deformation of a reflecting layer 210 may be as thick as possible, whereby a reflecting plate 250 may have improved resistance against thermal deformation. For example, a reflecting plate 250 may be from about 1 to about 2 mm, of which the thickness of reflecting layer 210 may be from about 1 to about 100 μm. Accordingly, a reflecting plate 250 may be formed by depositing a reflecting layer 210 onto a supporting layer 230 using a physical and/or chemical vapor deposition.

According to an example embodiment of the present invention, a reflecting plate 250 may further include a reaction prevention layer 270 which may be contact a supporting layer 230 to oppose a reflecting layer 210, as shown in FIG. 4. Accordingly, a reflecting plate 250 may include a reflecting layer 210, a reaction prevention layer 270, and a supporting layer 240 interposed between the reflecting layer 210 and the reaction prevention layer 270. A reaction prevention layer 270 may reduce and/or prevent a reaction between a supporting layer 230 and a particle such as an active radical, which may be contained in an ion beam I and move isotropically. According to an example embodiment of the present invention, a reaction prevention layer 270 may be made of the same material as a reflecting layer 210. For example, a reaction prevention layer 270 may be made of stainless steel, nickel-iron alloy, nickel-chromium alloy, or nickel-iron-chromium alloy. However, the material of the reaction prevention layer 270 is not limited thereto, and metal and/or alloy satisfying the above-described conditions may be adapted thereto without limitation.

Figure 5:
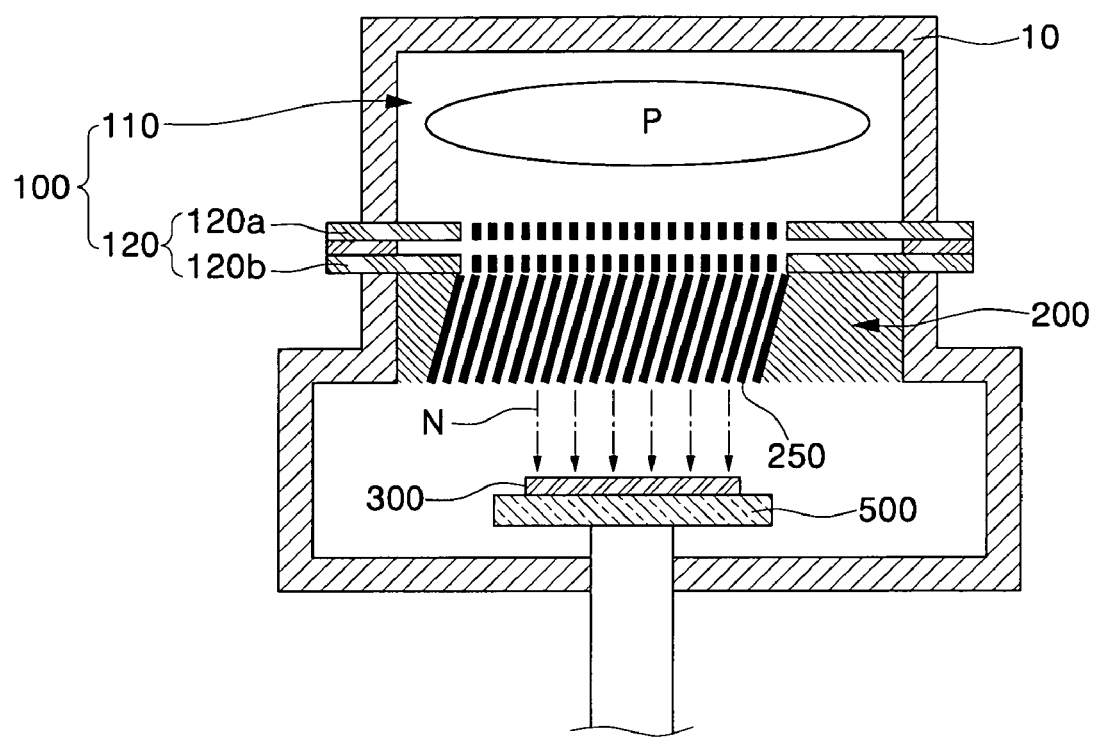
FIG. 5 is a constructional view illustrating an etching apparatus including a reflector according to an example embodiment of the present invention.

FIG. 5 is a constructional view illustrating an etching apparatus including a reflector according to an example embodiment of the present invention.

According to an example embodiment of the present invention as shown in FIG. 5, an ion source 100 may be provided in an upper region of a chamber 10. An ion source 100 may include a plasma generator 110 and/or a grid unit 120 disposed in a lower side of the plasma generator 110. A plasma generator which can generate plasma P from a reaction gas may be used an a plasma generator 110. For example, an inductively coupled plasma (ICP) which generates a plasma by applying an induced power to an inducing coil and/or capacitively coupled plasma (CCP) may be adapted. Further, electron cyclotron plasma (ECR) plasma and/or helicon plasma may be adapted.

A grid unit 120 may includes first and second grids 120a and 120b which may have a first through-hole and a second through-hole communicating to each other. Voltages with different values may be applied to the first and second grids 120a and 120b, and ions in a plasma P may be extracted through the through-holes and may be accelerated by potential difference generated at the time of applying the different voltages. Although a third grid is not shown in the drawing, a third grid may be provided at the lower side of the second grid 120b according to an example embodiment of the present invention. A third grid may keep the directionality of the extracted ions and may be grounded.

According to an example embodiment of the present invention, a reflector 200 may be provided at a lower side of a grid unit 120. As described above, a reflector 200 may include reflecting plates 250 having a reflecting layer 210 and a supporting layer 230. Reflecting plates 250 may be disposed parallel to each other and have a predetermined angle with respect to an ion beam comprised of the ions extracted through a grid unit 120. Further, reflecting plates 250 may further include a reaction prevention layer 270 which may contact with a supporting layer 230, as shown with respect to an example embodiment of the present invention in FIG. 4. Reflecting plates 250 were described in detail referring to FIGS. 2 to 4, and thus a description thereof will be omitted for the sake of brevity. An ion beam incident into a reflector 200 may lose its electric charge while the ion beam collides with a reflecting layer 210 and may be converted into a neutral beam N. Then, a neutral beam N may be incident into a substrate 300 to be processed. At this time, a neutral beam N may be perpendicular to a substrate 300 to be processed. The substrate 300 to be processed may be fixed on a substrate supporting member 500 disposed at the lower region of a chamber 10. Further, a specific material layer to be etched may be previously formed on a substrate 300 to be processed.

As described above, an etching device according to an example embodiment of the present invention may include a reflector 200 for generating the neutral beam. The reflector 200 may include reflecting plates 250 having a reflecting layer 210 and a supporting layer 230. Because a supporting layer 230 may have a high thermal conductivity, the supporting layer may have improved resistance against thermal deformation and may serve as a hot-sink emitting heat generated from a reflecting layer 210, thereby reducing and/or preventing thermal deformation of a reflecting plate 250. As a result, reflecting plates 250 may have thermal stability, which may at least partially result in an increased process yield of an etching device and a reduction and/or minimization of a process failure.

Example embodiments of the present invention may provide a reflector which may include at least one of a reflecting plate including a reflecting layer into which an ion beam may collide and a supporting layer capable of reducing and/or preventing thermal deformation of the reflecting layer due to improved thermal stability. As a result, reflecting plates may have improved resistance against thermal deformation as a whole. Further, the process yield of the substrate processing apparatus including the above-described reflecting plates may be increased and/or the process failure thereof may be reduced and/or minimized.

What is claimed is:

1. A reflector for generating a neutral beam, the reflector comprising:
   at least one reflecting plate including a reflecting layer onto which an ion beam collides, the reflecting layer reflecting the ion beam and converting the ion beam into a neutral beam, and a supporting layer reducing thermal deformation of the reflecting layer.
2. The reflector according to claim 1, wherein the supporting layer has a high thermal conductivity to reduce the thermal deformation of the reflecting layer.
3. The reflector according to claim 1, wherein the supporting layer has a thermal conductivity of about 100 W/m·K or more.
4. The reflector according to claim 1, wherein the supporting layer is made of a material selected from a group including aluminum, copper, silver, gold, molybdenum, tungsten, silicon, silicon carbide, tungsten carbide, and aluminum nitride.
5. The reflector according to claim 1, wherein the reflecting layer is made of at least one of stainless steel, nickel-iron alloy, nickel-chromium alloy, and nickel-iron-chromium alloy.
6. The reflector according to claim 1, wherein the supporting layer is made of molybdenum, and the reflecting layer is made of a nickel-iron alloy.
7. The reflector according to claim 1, further comprising:
   a reaction prevention layer contacting the supporting layer opposite the reflecting layer.
8. The reflector according to claim 7, wherein the reaction prevention layer is made of the same material as the reflecting layer.
9. The reflector according to claim 7, wherein the reaction prevention layer is made of at least one of stainless steel, nickel-iron alloy, nickel-chromium alloy, and nickel-iron-chromium alloy.
10. The reflector according to claim 1, wherein the reflecting layer and the supporting layer have a substantially equal coefficient of thermal expansion.
11. A substrate processing apparatus comprising:
    an ion source;
    a reflector arranged in a path of an ion beam supplied from the ion source, the reflector including at least one reflecting plate,
    wherein the at least one reflecting plate includes a reflecting layer onto which the ion beam collides, the reflecting layer reflecting and converting the ion beam into a neutral beam, and a supporting layer reducing thermal deformation of the reflecting layer; and
    a substrate support member holding a substrate to be processed and arranged in a path of the neutral beam.
12. The substrate processing apparatus according to claim 11, wherein the supporting layer has a high thermal conductivity to reduce the thermal deformation of the reflecting layer.
13. The substrate processing apparatus according to claim 11, wherein the supporting layer has a thermal conductivity of about 100 W/m·K or more.
14. The substrate processing apparatus according to claim 11, wherein the supporting layer is made of a material selected from a group including aluminum, copper, silver, gold, molybdenum, tungsten, silicon, silicon carbide, tungsten carbide, and aluminum nitride.
15. The substrate processing apparatus according to claim 11, wherein the reflecting layer is made of at least one of stainless steel, nickel-iron alloy, nickel-chromium alloy, and nickel-iron-chromium alloy.
16. The substrate processing apparatus according to claim 11, wherein the supporting layer is made of molybdenum, and the reflecting layer is made of nickel-iron alloy.
17. The substrate processing apparatus according to claim 11, the at least one reflector further including a reaction prevention layer contacting the supporting layer opposite the reflecting layer.
18. The substrate processing apparatus according to claim 17, wherein the reaction prevention layer is made of the same material as the reflecting layer.
19. The substrate processing apparatus according to claim 11, wherein the reflecting layer and the supporting layer have a substantially equal coefficient of thermal expansion.
20. The substrate processing apparatus according to claim 11, wherein the ion source includes a plasma generator and a grid unit which extracts ions from the plasma generator and accelerates the ions.
21. A substrate processing apparatus comprising:
    an ion source;
    a reflector according to claim 1; and
    a substrate support member holding a substrate to be processing and arranged in a path of a neutral beam.

* * * * *